United States Patent
Nakamura

(10) Patent No.: US 12,431,854 B2
(45) Date of Patent: *Sep. 30, 2025

(54) COMPOSITE ACOUSTIC WAVE FILTER DEVICE

(71) Applicant: Murata Manufacturing Co., Ltd., Nagaokakyo (JP)

(72) Inventor: Shinichi Nakamura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 342 days.

This patent is subject to a terminal disclaimer.

(21) Appl. No.: 18/110,397

(22) Filed: Feb. 16, 2023

(65) Prior Publication Data

US 2023/0198493 A1 Jun. 22, 2023

Related U.S. Application Data

(63) Continuation of application No. PCT/JP2021/029638, filed on Aug. 11, 2021.

(30) Foreign Application Priority Data

Aug. 24, 2020 (JP) .................................. 2020-141079

(51) Int. Cl.
  *H03H 9/00* (2006.01)
  *H03H 9/64* (2006.01)
  *H03H 9/72* (2006.01)

(52) U.S. Cl.
  CPC ........ *H03H 9/0009* (2013.01); *H03H 9/6483* (2013.01); *H03H 9/725* (2013.01)

(58) Field of Classification Search
  CPC ..... H03H 9/0009; H03H 9/6483; H03H 9/725
  See application file for complete search history.

(56) References Cited

U.S. PATENT DOCUMENTS

2010/0150075 A1* 6/2010 Inoue ................... H03H 9/0576
  370/328
2010/0225418 A1 9/2010 Kawamoto et al.
(Continued)

FOREIGN PATENT DOCUMENTS

JP 2010239612 A 10/2010
JP 5765501 B1 8/2015
(Continued)

OTHER PUBLICATIONS

International Search Report in PCT/JP2021/029638, mailed Oct. 26, 2021, 3 pages.

(Continued)

*Primary Examiner* — Samuel S Outten
(74) *Attorney, Agent, or Firm* — Keating & Bennett, LLP

(57) ABSTRACT

A composite acoustic wave filter device includes first and second acoustic wave filters. One end of the first acoustic wave filter with a pass band in a relatively low frequency range and one end of the second acoustic wave filter with a pass band in a relatively high frequency range are connected in common. A first end portion of a first parallel capacitance element and a third end portion of a second parallel capacitance element are connected to a signal line of the second acoustic wave filter. A ground-side end portion of the first parallel capacitance element is connected in common to a ground-side end portion of the first acoustic wave filter. A fourth end portion of the second parallel capacitance element is connected to a ground potential.

20 Claims, 4 Drawing Sheets

(56) References Cited

U.S. PATENT DOCUMENTS

| | | |
|---|---|---|
| 2016/0028366 A1 | 1/2016 | Takamine |
| 2016/0173061 A1 | 6/2016 | Takamine |
| 2016/0173062 A1 | 6/2016 | Takamine |
| 2017/0302252 A1* | 10/2017 | Hey-Shipton ............ H04B 1/40 |
| 2019/0044496 A1* | 2/2019 | Takamine ............ H03H 9/6483 |

FOREIGN PATENT DOCUMENTS

| | | |
|---|---|---|
| WO | 2014167752 A1 | 10/2014 |
| WO | 2015040922 A1 | 3/2015 |

OTHER PUBLICATIONS

Written Opinion in PCT/JP2021/029638, mailed Oct. 26, 2021, 3 pages.

\* cited by examiner

COMPOSITE ACOUSTIC WAVE FILTER DEVICE

CROSS REFERENCE TO RELATED APPLICATIONS

This application claims the benefit of priority to Japanese Patent Application No. 2020-141079 filed on Aug. 24, 2020 and is a Continuation Application of PCT Application No. PCT/JP2021/029638 filed on Aug. 11, 2021. The entire contents of each application are hereby incorporated herein by reference.

BACKGROUND OF THE INVENTION

1. Field of the Invention

The present invention relates to a composite acoustic wave filter device in which ends of first and second acoustic wave filters with different pass bands are connected in common.

2. Description of the Related Art

For example, in a reception stage in an existing smartphone, a duplexer is used. In a duplexer disclosed in Japanese Patent No. 5765501, one end of a transmission filter including an acoustic wave filter and one end of a reception filter including an acoustic wave filter are connected in common to an antenna terminal. In Japanese Patent No. 5765501, the other end of a parallel capacitor whose one end is connected to a signal line of the reception filter is connected in common to a ground-side end portion of a parallel-arm resonator of the transmission filter.

SUMMARY OF THE INVENTION

In the duplexer disclosed in Japanese Patent No. 5765501, the ground potential-side end portion of the above-described parallel capacitor and the ground potential-side end portion of the parallel-arm resonator of the transmission filter are connected to each other. It is considered that this achieves an increase in attenuation and an improvement in isolation characteristics in a pass band of the transmission filter in the reception filter.

In the configuration disclosed in Japanese Patent No. 5765501, however, there is a limit to an improvement in attenuation in the pass band of the transmission filter in the reception filter, that is, an improvement in attenuation characteristics at frequencies lower than a pass band of the reception filter, and an improvement in isolation characteristics is also still insufficient.

Preferred embodiments of the present invention provide composite acoustic wave filter devices that each achieve further improvements in attenuation characteristics and isolation characteristics at frequencies lower than a pass band in a relatively high frequency range.

A composite acoustic wave filter device according to a preferred embodiment of the present invention includes a first acoustic wave filter with a pass band in a relatively low frequency range, and a second acoustic wave filter that includes a signal line connecting a first input-output end and a second input-output end, in which the first input-output end is connected in common to one end of the first acoustic wave filter, and with a pass band in a relatively high frequency range. The composite acoustic wave filter device includes a first parallel capacitance element that includes a first end portion and a second end portion, in which the first end portion is connected to the signal line, and in which the second end portion is connected to a portion of the first acoustic wave filter connected to a ground potential, and a second parallel capacitance element that includes a third end portion and a fourth end portion, in which the third end portion is connected to the signal line, and in which the fourth end portion is connected to the ground potential.

Preferred embodiments of the present invention provide composite acoustic wave filter devices that each achieve further improvements in attenuation characteristics and isolation characteristics at frequencies lower than a pass band of the second acoustic wave filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will be described below with reference to the drawings to clarify the present invention.

Incidentally, preferred embodiments described in the present description are illustrative, and configurations can be partially replaced or combined with each other between different preferred embodiments.

Figure 1:
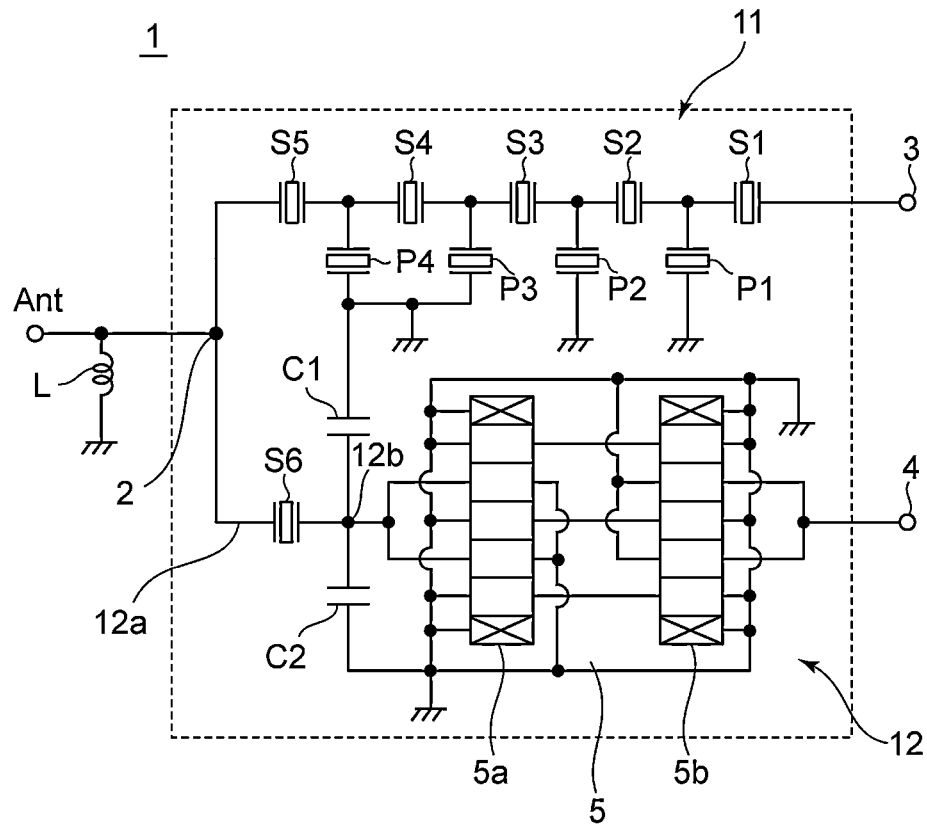
FIG. 1 is a circuit diagram of a composite acoustic wave filter device according to a first preferred embodiment of the present invention.

FIG. 1 is a circuit diagram of a composite acoustic wave filter device according to a first preferred embodiment of the present invention. A composite acoustic wave filter device 1 is a duplexer for use in a reception stage of a mobile communication device, such as a smartphone.

The composite acoustic wave filter device 1 includes a first acoustic wave filter 11 and a second acoustic wave filter 12. The first acoustic wave filter 11 is a transmission filter for Band 12. The pass band of the first acoustic wave filter 11 ranges from about 699 MHz to about 716 MHz.

The second acoustic wave filter 12 is a reception filter for Band 12. The pass band of the second acoustic wave filter 12, that is, a reception band ranges from about 729 MHz to about 746 MHz.

An output end of the first acoustic wave filter 11 and an input end of the second acoustic wave filter 12 are connected to a common connection terminal 2. The common connection terminal 2 is connected to an antenna terminal Ant.

An inductance L to adjust an impedance is connected between the common connection terminal 2 and a ground potential.

The first acoustic wave filter 11 is connected between the common connection terminal 2 and a transmission terminal 3. The first acoustic wave filter 11 is a ladder filter and includes, as a plurality of electronic component elements, a plurality of series-arm resonators S1 to S5, and a plurality of parallel-arm resonators P1 to P4. The series-arm resonators S1 to S5 are provided in a series arm connecting the transmission terminal 3 and the common connection terminal 2. The parallel-arm resonators P1 to P4 are connected between the above-described series arm and the ground potential.

Each of the plurality of series-arm resonators S1 to S5 and plurality of parallel-arm resonators P1 to P4 includes an acoustic wave resonator. In the first acoustic wave filter 11, the numbers of series-arm resonators and parallel-arm resonators are not limited to particular numbers.

Incidentally, ground potential-side end portions of the parallel-arm resonator P3 and parallel-arm resonator P4 are connected in common.

The second acoustic wave filter 12 is connected between the common connection terminal 2 and a reception terminal 4. Incidentally, the second acoustic wave filter 12 includes a first input-output end, a second input-output end, and a signal line 12a connecting the first input-output end and the second input-output end. In this preferred embodiment, the first input-output end is an input end, and the second input-output end is an output end. As described above, the input end is connected to the common connection terminal 2. The output end is connected to the reception terminal 4. In the signal line 12a connecting this common connection terminal 2 and the reception terminal 4, as a plurality of electronic component elements, a series-arm resonator S6 and a longitudinally coupled resonator acoustic wave filter 5 are connected in series. The series-arm resonator S6 includes an acoustic wave resonator. Furthermore, the longitudinally coupled resonator acoustic wave filter 5 has a structure in which a 5-IDT first longitudinally coupled resonator acoustic wave filter unit 5a and a 5-IDT second longitudinally coupled resonator acoustic wave filter unit 5b are cascade-connected. Nevertheless, the structure of the longitudinally coupled resonator acoustic wave filter 5 is not to be limited to this.

In the composite acoustic wave filter device 1, in the signal line 12a of the second acoustic wave filter 12, a first end portion of a first parallel capacitance element C1 and a third end portion of a second parallel capacitance element C2 are connected between the series-arm resonator S6 and the longitudinally coupled resonator acoustic wave filter 5. A second end portion of the first parallel capacitance element C1 is an end portion to be connected to the ground potential and is connected to the ground potential-side end portions of the parallel-arm resonators P3 and P4 of the first acoustic wave filter 11. Incidentally, the second end portion of the first parallel capacitance element C1 only has to be connected to, of at least one electronic component element, a portion connected to the ground potential.

On the other hand, a fourth end portion of the second parallel capacitance element C2, that is, an end portion to be connected on the ground potential side is connected to, of the longitudinally coupled resonator acoustic wave filter 5, a portion connected to the ground potential.

The first parallel capacitance element C1 is provided as in the parallel capacitor in the duplexer disclosed in Japanese Patent No. 5765501. A feature of this preferred embodiment is that the second parallel capacitance element C2 is connected in addition to the first parallel capacitance element C1. The second parallel capacitance element C2 is connected between the signal line 12a and the ground potential, thus enabling, in transmission characteristics of the second acoustic wave filter 12, an increase in attenuation at frequencies lower than the pass band, in particular, in the pass band of the first acoustic wave filter 11, and further enabling an improvement in isolation characteristics.

To clarify this, characteristics of the following Example 1 and Comparative Example 1 will be described.

As Example 1, the composite acoustic wave filter device 1 based on the following design parameters is prepared.

Design Parameters of First Acoustic Wave Filter 11
  Metallization ratio: 0.50 to 0.55
  Intersecting width: 15 µm to 210 µm Design Parameters of Second Acoustic Wave Filter 12
  Metallization ratio: 0.60 to 0.65
  Intersecting width: 85 µm to 125 µm
  Capacitance of the first parallel capacitance element C1=0.75 pF.
  Capacitance of the second parallel capacitance element C2=0.75 pF.

Comparative Example 1 is similar to the above-described Example 1 except that the above-described second parallel capacitance element C2 is not included.

Figure 2:
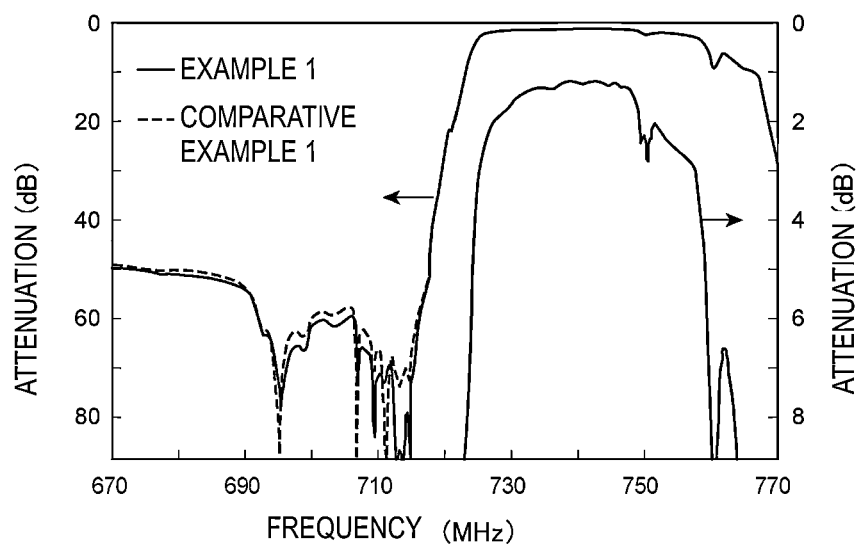
FIG. 2 illustrates attenuation-frequency characteristics of second acoustic wave filters in composite acoustic wave filter devices of Example 1 and Comparative Example 1.
Figure 3:
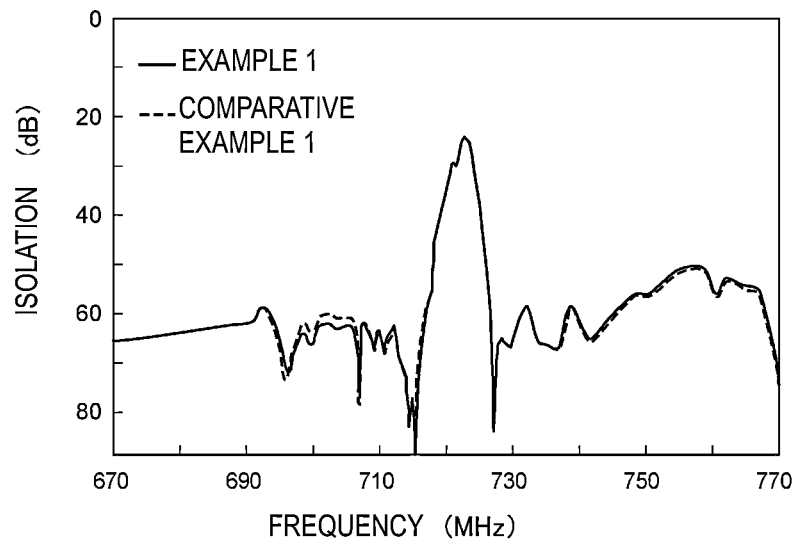
FIG. 3 illustrates isolation characteristics in the composite acoustic wave filter devices of Example 1 and Comparative Example 1.

FIG. 2 illustrates attenuation-frequency characteristics of second acoustic wave filters in composite acoustic wave filter devices of Example 1 and Comparative Example 1, and FIG. 3 illustrates isolation characteristics.

In FIGS. 2 and 3, a solid line represents results of Example 1, and a dashed line represents results of Comparative Example 1.

As is clear from FIG. 2, Example 1 is larger than Comparative Example 1 in attenuation, in transmission characteristics of the second acoustic wave filter 12, in a lower frequency range than the range from about 729 MHz to about 746 MHz, which is the pass band, in particular, in the range from about 699 MHz to about 716 MHz, which is the pass band of the first acoustic wave filter 11. Furthermore, it is seen that isolation in this band has also been significantly improved. Additionally, it is seen that transmission characteristics in the pass band itself of the second acoustic wave filter 12 are unchanged between Example 1 and Comparative Example 1.

That is, it is seen that, in the second acoustic wave filter 12, the connection of the above-described second parallel capacitance element C2 can facilitate an increase in attenuation and an improvement in isolation characteristics in the pass band of the first acoustic wave filter 11 without increasing loss in its own band.

Figure 4:
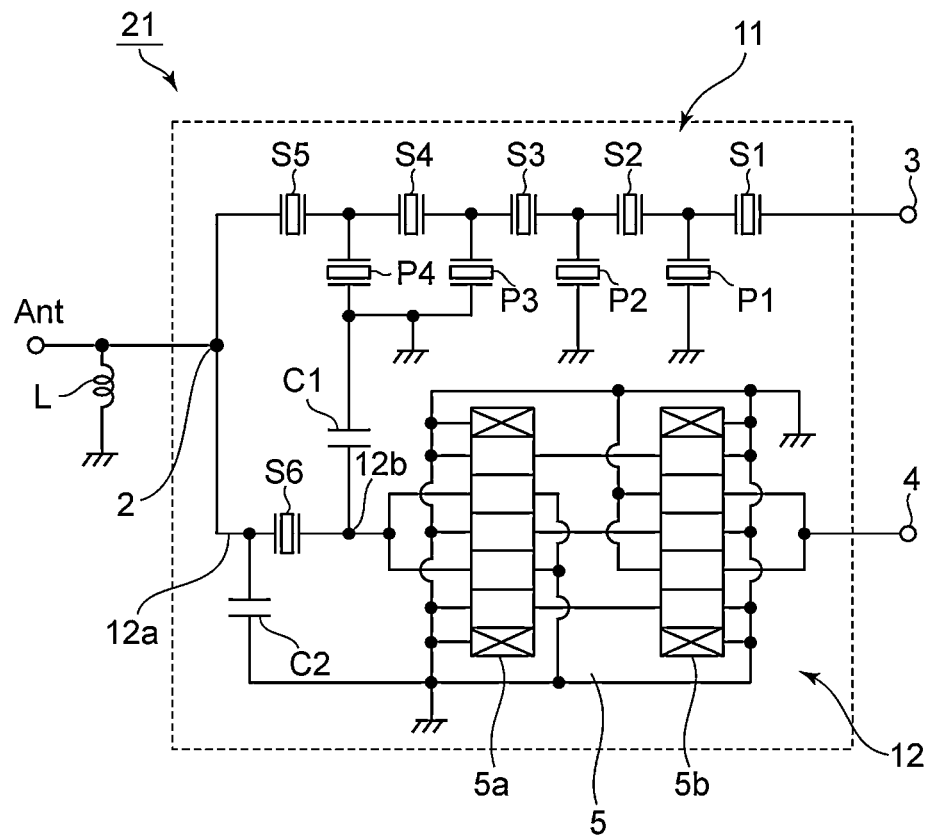
FIG. 4 is a circuit diagram of a composite acoustic wave filter device according to a second preferred embodiment of the present invention.

FIG. 4 is a circuit diagram of a composite acoustic wave filter device according to a second preferred embodiment of the present invention. In a composite acoustic wave filter device 21 according to the second preferred embodiment, a position in the signal line 12a to which the third end portion of the second parallel capacitance element C2 is connected differs from that in the first preferred embodiment. That is, the third end portion, which is a signal line 12a-side end portion of the second parallel capacitance element C2, is connected on a common connection terminal 2 side of the series-arm resonator S6, that is, on an input end side. Hence, the third end portion of the second parallel capacitance element C2 and the first end portion of the first parallel capacitance element C1 are connected to different potential portions in the signal line 12a. Thus, in a preferred embodiment of the present invention, the first end portion of the first parallel capacitance element C1 and the third end portion of the second parallel capacitance element C2 may be connected to different potential portions in the signal line 12a.

A composite acoustic wave filter device of Example 2 is configured as in the above-described Example 1 except that a position to which the third end portion of the second parallel capacitance element C2 is connected is changed as described above.

Figure 5:
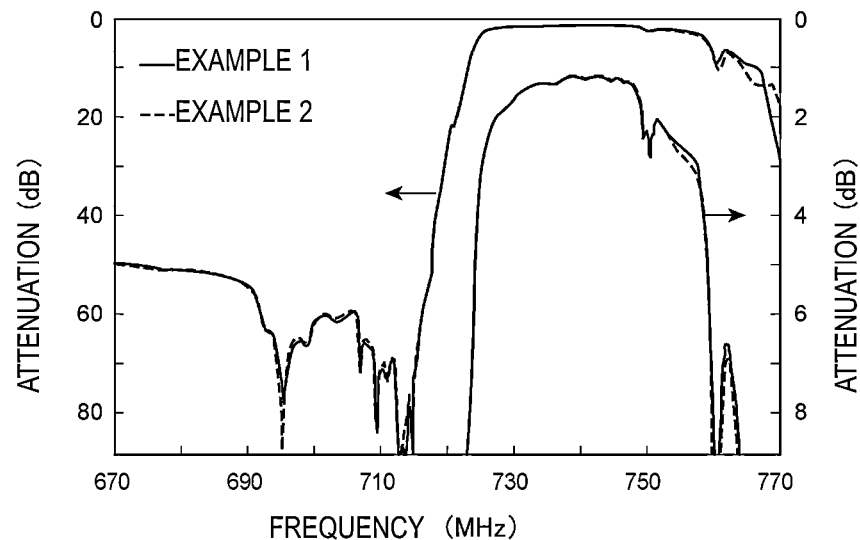
FIG. 5 illustrates attenuation-frequency characteristics of second acoustic wave filters in composite acoustic wave filter devices of Example 1 and Example 2.
Figure 6:
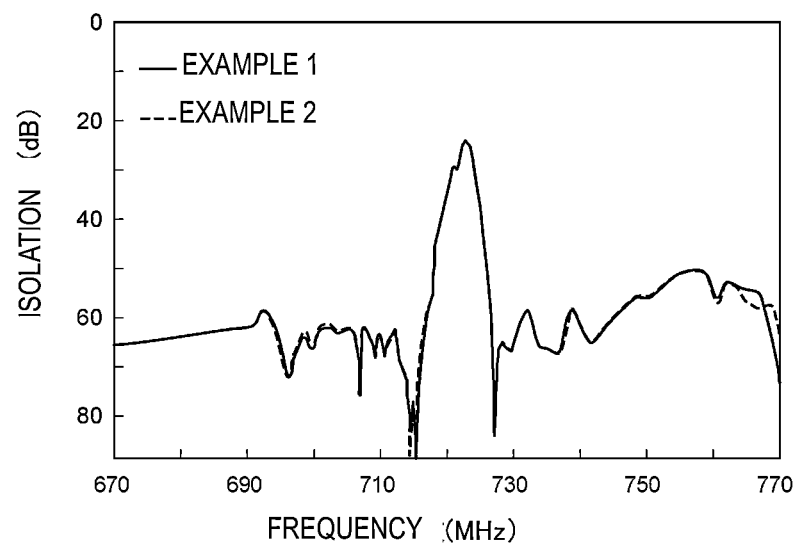
FIG. 6 illustrates isolation characteristics in the composite acoustic wave filter devices of Example 1 and Example 2.

FIG. 5 illustrates attenuation-frequency characteristics of second acoustic wave filters in the composite acoustic wave filter devices of Example 1 and Example 2, and FIG. 6 illustrates isolation characteristics.

In FIGS. 5 and 6, a solid line represents results of Example 1, and a dashed line represents results of Example 2.

As is clear from FIGS. 5 and 6, it is seen that, in Example 2, the effect of improving attenuation in the pass band of the first acoustic wave filter 11, which is a transmission filter, decreases slightly in comparison with Example 1, and that the effect of improving isolation characteristics also decreases slightly.

Hence, as in Example 1, that is, as in the first preferred embodiment, it is desirable that the first end portion of the first parallel capacitance element C1 and the third end portion of the second parallel capacitance element C2 be connected to the same potential portion in the signal line 12a. Thus, the effect of improving attenuation and isolation at frequencies lower than the pass band can be further enhanced.

Incidentally, in the second acoustic wave filter 12, when a plurality of electronic component elements, such as the above-described series-arm resonator S6, and first and second longitudinally coupled resonator acoustic wave filter units 5a and 5b, are connected in series in the signal line 12a, it is desirable that adjacent electronic component elements between which the first end portion of the first parallel capacitance element C1 is connected be the same as adjacent electronic component elements between which the third end portion of the second parallel capacitance element C2 is connected.

In this case, like a node 12b illustrated in the circuit diagram of FIG. 1, a common connection does not have to be made at the node 12b, which refers to the same connection point. In other words, the first end portion of the first parallel capacitance element C1 and the third end portion of the second parallel capacitance element C2 only have to be connected to any position between an output end of the series-arm resonator S6 and an input end of the first longitudinally coupled resonator acoustic wave filter unit 5a. Incidentally, in the second acoustic wave filter 12, the series-arm resonator S6 is an electronic component element closest to the common connection terminal 2.

Figure 7:
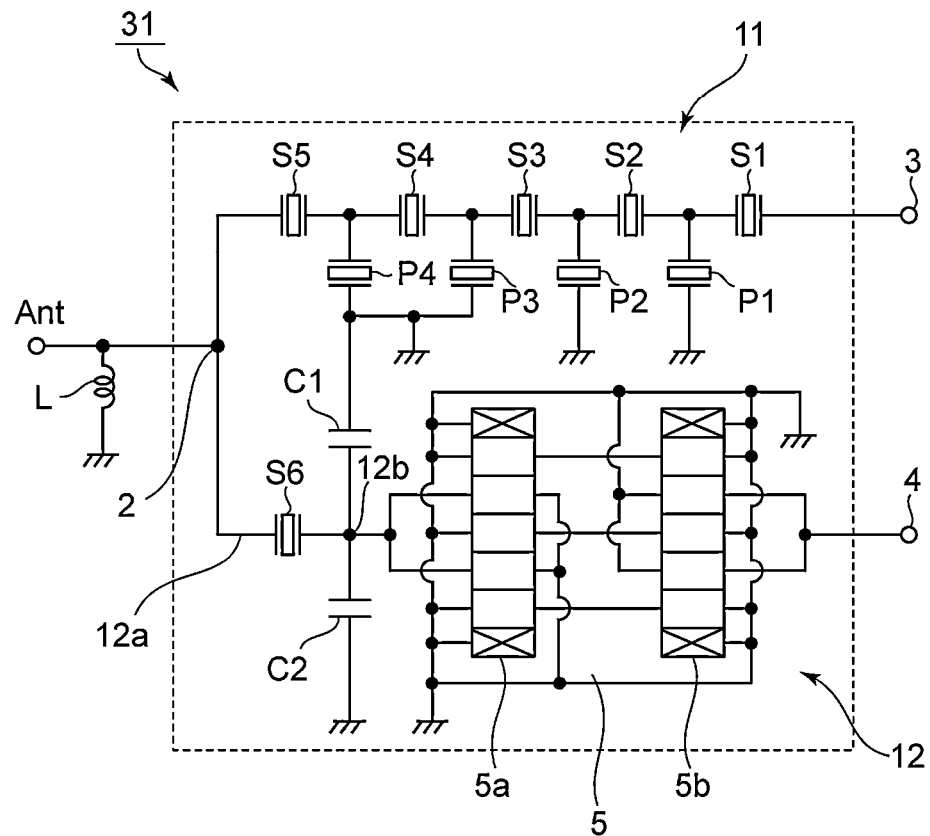
FIG. 7 is a circuit diagram of a composite acoustic wave filter device according to a third preferred embodiment of the present invention.

FIG. 7 is a circuit diagram of a composite acoustic wave filter device according to a third preferred embodiment of the present invention.

In a composite acoustic wave filter device 31 according to the third preferred embodiment, the fourth end portion of the second parallel capacitance element C2 is independently connected to the ground potential. Thus, a ground-side end portion of the second parallel capacitance element C2 does not have to be connected in common to a ground-side end portion of another electronic component element of the second acoustic wave filter 12. In this case as well, as in the first preferred embodiment, the connection of the second parallel capacitance element C2 can improve impedance matching in the second acoustic wave filter 12 and adjustments to the position of an attenuation pole and attenuation based on the first and second parallel capacitance elements C1 and C2. Hence, an improvement in attenuation and an improvement in isolation characteristics at frequencies lower than the pass band in the second acoustic wave filter 12 can be achieved.

In a preferred embodiment of the present invention, individual circuit configurations of the first acoustic wave filter 11 and the second acoustic wave filter 12 are not limited to particular circuit configurations. The first acoustic wave filter 11 is a ladder filter, and the second acoustic wave filter 12 may also be a ladder filter including a series-arm resonator and a parallel-arm resonator.

Figure 8:
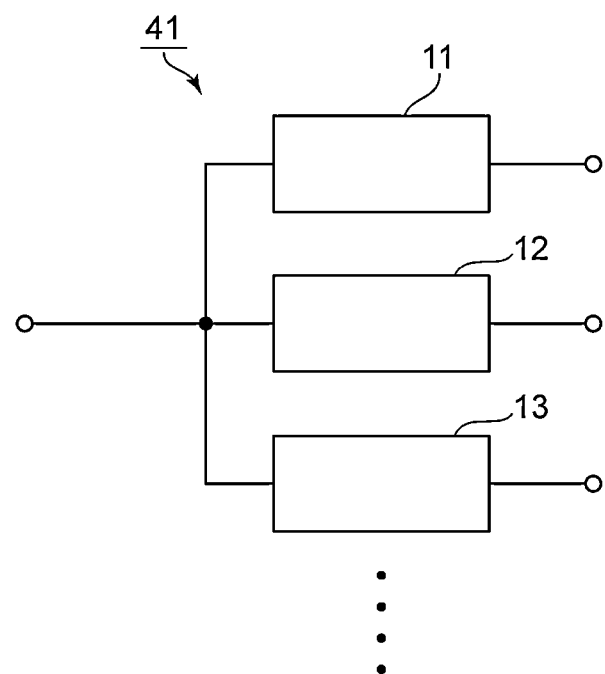
FIG. 8 is a circuit diagram of a composite acoustic wave filter device according to a fourth preferred embodiment of the present invention.

Furthermore, FIG. 8 is a circuit diagram of a composite acoustic wave filter device according to a fourth preferred embodiment of the present invention. A composite acoustic wave filter device 41 has at least one bandpass filter 13, in addition to the first and second acoustic wave filters 11 and 12, and ends of at least one band pass filter 13 is connected in common to ends of the first and second acoustic wave filters 11 and 12. Thus, a composite acoustic wave filter device according to a preferred embodiment of the present invention may further include, in addition to first and second acoustic wave filters, one or more other band pass filters.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite acoustic wave filter device comprising:
  a first acoustic wave filter that includes a pass band in a relatively low frequency range;
  a second acoustic wave filter that includes a pass band in a relatively high frequency range and a signal line connecting a first input-output end and a second input-output end, the first input-output end being connected in common to one end of the first acoustic wave filter;
  a first parallel capacitance element that includes a first end portion and a second end portion, the first end portion being connected to the signal line separately from the first and second input-output ends, and the second end portion being connected to a portion of the first acoustic wave filter connected to a ground potential; and
  a second parallel capacitance element that includes a third end portion and a fourth end portion, the third end portion being connected to the signal line, and the fourth end portion being connected to the ground potential separately from the second end portion of the first parallel capacitance element.

2. The composite acoustic wave filter device according to claim 1, wherein the first end portion of the first parallel capacitance element and the third end portion of the second parallel capacitance element are connected to a same potential portion in the signal line.

3. The composite acoustic wave filter device according to claim 2, wherein the second acoustic wave filter includes a plurality of electronic component elements connected in series in the signal line; and the first end portion of the first parallel capacitance element and the third end portion of the second parallel capacitance element are connected between a same pair of electronic component elements of pairs of the adjacent electronic component elements in the signal line.

4. The composite acoustic wave filter device according to claim 3, wherein the plurality of electronic component elements include a series-arm resonator or a longitudinally coupled resonator acoustic wave filter unit.

5. The composite acoustic wave filter device according to claim 3, wherein the plurality of electronic component elements include a series-arm resonator and first and second longitudinally coupled resonator acoustic wave filter units, connected in series in the signal line.

6. The composite acoustic wave filter device according to claim 1, wherein an output end of the first acoustic wave filter and an input end of the second acoustic wave filter are connected to a common connection terminal that is connected to an antenna.

7. The composite acoustic wave filter device according to claim 6, wherein the first acoustic wave filter is connected between the common connection terminal and a transmission terminal.

8. The composite acoustic wave filter device according to claim 7, wherein the first acoustic wave filter includes a plurality of series-arm resonators and a plurality of parallel-arm resonators, the plurality of series-arm resonators being provided in a series arm connecting the transmission terminal to the common connection terminal, and the plurality of parallel-arm resonators being connected between the series arm and a ground potential.

9. The composite acoustic wave filter device according to claim 6, wherein an impedance is connected between the common connection terminal and a ground potential.

10. The composite acoustic wave filter device according to claim 6, wherein the second acoustic wave filter is connected between the common connection terminal and a reception terminal.

11. The composite acoustic wave filter device according to claim 1, wherein the second acoustic wave filter includes a series-arm resonator and a longitudinally coupled resonator acoustic wave filter that are connected in series in the signal line.

12. The composite acoustic wave filter device according to claim 1, wherein the second acoustic wave filter is a ladder filter including a series-arm resonator including an acoustic wave resonator connected in series in the signal line, and a parallel-arm resonator connected between the signal line and the ground potential and including an acoustic wave resonator.

13. The composite acoustic wave filter device according to claim 1, wherein the fourth end portion of the second parallel capacitance element is connected to a portion of the second acoustic wave filter connected to the ground potential.

14. The composite acoustic wave filter device according to claim 1, wherein
the first acoustic wave filter includes a plurality of electronic component elements; and
the second end portion of the first parallel capacitance element is connected to an end portion of at least one of the electronic component elements of the first acoustic wave filter connected to the ground potential.

15. The composite acoustic wave filter device according to claim 1, wherein the first acoustic wave filter is a ladder filter including a series-arm resonator including an acoustic wave resonator and a parallel-arm resonator including an acoustic wave resonator.

16. The composite acoustic wave filter device according to claim 11, wherein, in the signal line, an electronic component element closest to the first input-output end is the series-arm resonator, and the first end portion of the first parallel capacitance element and the third end portion of the second parallel capacitance element are connected to an end portion of the series-arm resonator closest to the first input-output end and opposite to the first input-output end.

17. The composite acoustic wave filter device according to claim 1, further comprising at least one band pass filter including an end connected in common to ends of the first acoustic wave filter and the second acoustic wave filter.

18. The composite acoustic wave filter device according to claim 1, wherein the composite acoustic wave filter device is a duplexer.

19. The composite acoustic wave filter device according to claim 1, wherein pass band of the first acoustic wave filter ranges from about 699 MHz to about 716 MHz and the pass band of the second acoustic wave filter ranges from about 729 MHz to about 746 MHz.

20. The composite acoustic wave filter device according to claim 1, wherein first acoustic wave filter is a ladder filter, and the second acoustic wave filter is a ladder filter including a series-arm resonator and a parallel-arm resonator.

* * * * *